United States Patent
Gardner et al.

[11] Patent Number: 6,084,280
[45] Date of Patent: *Jul. 4, 2000

[54] TRANSISTOR HAVING A METAL SILICIDE SELF-ALIGNED TO THE GATE

[75] Inventors: Mark I. Gardner, Cedar Creek; Frederick N. Hause; Charles E. May, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/173,233

[22] Filed: Oct. 15, 1998

[51] Int. Cl.[7] .......................... H01L 29/76; H01L 29/94; H01L 31/062

[52] U.S. Cl. .......................... 257/412; 257/410; 257/411; 257/413; 257/638; 257/639; 257/640; 257/649; 257/650; 257/641; 257/777; 257/288; 257/204; 257/213; 257/249; 257/250; 257/262; 257/263; 257/274

[58] Field of Search .................... 257/411, 410, 257/412, 413, 638, 639, 640, 649, 650, 641, 777, 288, 204, 213, 249, 250, 262, 263, 274

[56] References Cited

U.S. PATENT DOCUMENTS

| | | |
|---|---|---|
| 4,683,645 | 8/1987 | Naguib et al. . |
| 4,731,339 | 3/1988 | Ryan et al. . |
| 4,992,387 | 2/1991 | Tamura . |
| 5,252,502 | 10/1993 | Havemann . |
| 5,268,590 | 12/1993 | Pfiester et al. .......................... 257/764 |
| 5,445,977 | 8/1995 | Fujimoto . |
| 5,576,227 | 11/1996 | Hsu . |
| 5,583,067 | 12/1996 | Sanchez .................................... 437/44 |

(List continued on next page.)

FOREIGN PATENT DOCUMENTS

| | | |
|---|---|---|
| 0614226 | 9/1994 | European Pat. Off. . |
| 1923279 | 12/1970 | Germany . |
| 359034665 | 2/1984 | Japan . |
| 59-215774 | 12/1984 | Japan . |
| 360195978 | 10/1985 | Japan . |

OTHER PUBLICATIONS

Wolf et al., "Silicon Processing For the VLSI Era, vol. 1: Process Technology," Lattice Press, Sunset Beach, California, 1986, pp. 384–406, and pp. 516–518, 1986.
Wolf et al., "Silicon Processing For the VLSI Era, vol. 2: Process Techology," Lattice Press, Sunset Beach, California, 1990, pp. 143–152, 1990.

*Primary Examiner*—Mahshid Saadat
*Assistant Examiner*—Matthew Warren
*Attorney, Agent, or Firm*—Conley, Rose & Tayon, P.C.; Robert C. Kowert

[57] ABSTRACT

A transistor having a source/drain metal silicide in close proximity to the channel region may be formed according to the following process. A masking structure is formed upon a semiconductor substrate, and a metal is deposited self-aligned to sidewall surfaces of the masking structure. The metal is then annealed to form a metal silicide. Following formation of lightly doped drain impurity areas self-aligned to the sidewall surfaces of the masking structure, spacers may be formed adjacent the sidewall surfaces and source and drain impurity areas may be formed self-aligned to sidewall surfaces of the spacers. Fill structures are then formed adjacent the spacers and the masking structure is removed to form an opening between the spacers. A gate dielectric is formed upon the exposed upper surface of the semiconductor substrate within the opening, and a gate conductor is formed within the opening. According to one embodiment, the fill structures are removed and an interlevel dielectric is formed upon the transistor. In an alternative embodiment, the fill structures include a dielectric material and are retained as interlevel dielectrics. In a further embodiment, the fill structures include a conductive material and are retained as contacts between the source and drain areas and subsequently formed interconnects. The current transistor may be formed such that the metal silicide is aligned with the gate dielectric and is located in close proximity to the channel region.

41 Claims, 5 Drawing Sheets

U.S. PATENT DOCUMENTS

| | | | |
|---|---|---|---|
| 5,646,435 | 7/1997 | Hsu et al. | 257/382 |
| 5,654,570 | 8/1997 | Agnello | 257/338 |
| 5,717,254 | 2/1998 | Hashimoto | 257/773 |
| 5,821,594 | 10/1998 | Kasai | 257/410 |
| 5,834,811 | 11/1998 | Huang . | |
| 5,918,130 | 6/1999 | Hause et al. . | |

TRANSISTOR HAVING A METAL SILICIDE SELF-ALIGNED TO THE GATE

BACKGROUND OF THE INVENTION

1. Field of the Invention

This invention relates to integrated circuit fabrication and, more particularly, to fabricating a transistor having a metal silicide formed in close proximity to the gate.

2. Description of the Related Art

Fabrication of silicon integrated circuits involves the creation of isolated device active regions within a single-crystal substrate. High-conductivity, thin-film structures fabricated over isolation and interlevel dielectric regions are used to connect these devices. Generally, metal-semiconductor contacts exhibit resistance to the flow of current across the contact due to differences between the work function of the semiconductor and the work function of the metal. It is thus necessary to modify the contact such that it exhibits a near-linear current-voltage relationship in both directions of current flow and such that it possesses negligible resistance when compared to the bulk resistance of the semiconductor.

One way to do this is to heavily dope the semiconductor substrate, which increases charge transport across the metal-semiconductor contact due to quantum-mechanical tunneling. Because contact resistance is inversely proportional to the surface concentration of the dopant, it would seem desirable to dope the substrate with as heavy a dopant concentration as is possible. The maximum doping concentration, however, is limited by the solid solubility of the dopant within the substrate at the temperature at which the dopant is introduced and by dopant clustering effects.

Further, as device dimensions have shrunk, it has become necessary to reduce the depth of the doped junction regions. This has limited the ability of the doped regions alone to reduce the resistance of the contact, because forming shallower junctions typically necessitates decreasing the dopant concentration. In addition, as the contact dimensions decrease, the contact resistance increases, as does the resistivity of the shallow junctions. Self-aligned silicide ("salicide") technology can be used to reduce these resistance values. According to the salicide technique, a metal is deposited across a MOSFET and reacted with exposed silicon areas of the source and drain, as well as exposed polysilicon areas on the gate, to form a silicide.

The area of the silicon-silicide interface is much larger than the area of a silicon-metal contact. In addition, the metal-silicide contact resistance is much lower than the metal-silicon resistance. As such, the salicide process allows a reduction in contact resistance. Formation of a metal silicide upon the contact areas is not, however, without some disadvantages. For example, in order to prevent shorting of the junctions to the gate conductor, insulating spacers must be formed adjacent the gate. The spacers prevent deposition of metal upon the sides of the polysilicon gate conductor. Because silicides typically do not form upon the spacers, the spacers also prevent "bridging" between silicide formed upon the junctions and silicide desirably formed upon the gate conductor upper surfaces ("polycide"). The spacers, however, separate the silicide from the channel region, such that current still must flow some distance from the contact through the higher-resistivity silicon substrate to reach the channel.

In addition, during silicide formation, a portion of the substrate is consumed. If the silicide is formed over a shallow junction, the formation process must be carefully monitored to ensure that the shallow junction is not totally consumed. As such, it would be desirable to fabricate a transistor having silicide formed over a shallow junction without the danger of consuming the junction region during processing. It would further be desirable to fabricate a transistor having metal silicides formed in close proximity to the gate to decrease the resistivity associated with the source-to-drain conductive pathway.

SUMMARY OF THE INVENTION

The problems outlined above may be solved by the technique hereof for forming a transistor having a metal silicide in close proximity to the gate conductor. According to the process of the present application, a masking structure is formed upon an upper surface of a semiconductor substrate. The semiconductor substrate preferably includes single-crystalline silicon, and the masking structure preferably includes a non-silicon-rich material. For purposes of this application, "non-silicon-rich" materials include both materials having no silicon present in their make-up and materials containing silicon in either insufficient amounts or improper chemical forms to allow reaction with a metal to form a metal silicide. For example, a non-silicon-rich material suitable for use as the masking structure may include a dielectric such a silicon dioxide ("oxide"), silicon nitride ("nitride"), or silicon oxynitride ("oxynitride"). Preferably, the masking structure includes oxide.

The masking structure may be formed by depositing a masking material upon the semiconductor substrate and selectively patterning and etching the masking material using well-known photolithography techniques. A metal may then be deposited across the masking structure and the exposed upper surfaces of the semiconductor substrate. Preferably, the masking material is deposited to a thickness between about 800 angstroms and about 2000 angstroms, and the metal is deposited to a thickness between about 100 angstroms and about 300 angstroms. In an embodiment, the upper surface of the semiconductor substrate may be cleaned prior to deposition of the metal layer using, for example, the well-known RCA method. The RCA method is described in S. Wolf and R. N. Tauber, *Silicon Processing for the VLSI Era*, Vol. 1-*Process Technology*, pp.516–518 (Lattice Press, Sunset Beach, Calif.; 1986), which is incorporated herein by reference. In an embodiment, the metal may be sputter deposited; alternatively, the metal may be chemical-vapor deposited. Preferably, the metal includes cobalt. Alternatively, the metal may include nickel or a refractory metal such as titanium.

Following formation of the metal layer, radiation may be used to anneal the semiconductor substrate and the metal layer to form a silicide layer, preferably having a thickness between about 200 angstroms and about 600 angstroms, upon the semiconductor substrate and self-aligned with sidewalls of the masking structure. Preferably, use of a non-silicon-rich masking material prevents silicide formation upon the masking structure. Because titanium, however, is able to form a silicide when annealed in the presence of silicon dioxide, the metal layer should not include titanium when the masking structure includes silicon dioxide. Annealing preferably occurs in a rapid thermal processing chamber at temperatures between about 600° and about 700° C. for about 15–60 seconds. Annealing may also occur in a tube furnace for about 5–30 minutes at a temperature of about 600°–800° C. The annealing ambient is preferably an inert ambient, which may contain nitrogen, helium, and/or argon. Following the anneal, unreacted metal may be removed from the masking structure using, e.g., a wet etch selective for the unreacted metal.

Lightly doped drain ("LDD") impurity areas may then be formed in the semiconductor substrate self-aligned with sidewall surfaces of the masking structure. In an embodiment, n-type species such as arsenic or phosphorous may be implanted if an NMOS is desired and p-type species such as boron may be implanted if a PMOS is desired. Dopants may be implanted at a concentration of between about $8.0\times10^{14}$ cm$^{-2}$ and about $3.0\times10^{15}$ cm$^{-2}$ and an energy of between about 0.5 keV and 5.0 keV to form the LDD areas. After the LDD areas are formed, spacers may be formed laterally adjacent the sidewall surfaces of the masking structure and upon the metal silicide. In an embodiment, the spacers may have a lateral thickness between about 200 angstroms and about 500 angstroms. Preferably, the spacers include a material having etch characteristics different from the etch characteristics of the masking material and the silicide. For example, if the masking structure includes oxide, the spacers preferably include nitride. The spacers may be formed by, e.g., chemical-vapor deposition of the spacer material across the semiconductor topography and selective etch to preferentially remove material deposited adjacent substantially horizontal surfaces while retaining spacer material deposited adjacent substantially vertical surfaces.

Source and drain ("S/D") impurity areas may then be formed self-aligned with sidewall surfaces of the spacers by, e.g., implanting dopant ions of the same type as the LDD implants at a concentration and an energy greater than the concentration and the energy used form the LDD implants. For example, dopant ions may be implanted at a concentration between about $2.0\times10^{15}$ cm$^{-2}$ and about $8.0\times10^{15}$ cm$^{-2}$ and at an energy between about 1 keV and 10 keV. As an alternative, the LDD implant may be omitted and the S/D implant may be performed either aligned with the masking structure or with spacers formed adjacent the sidewalls of the masking structure. Following formation of the LDD and/or S/D areas, the semiconductor topography may be annealed to activate the dopants and to repair damage to the substrate. The second anneal may be performed in a rapid thermal processing chamber at temperatures between about 750° C. and about 950° C. for about 10–30 seconds. Annealing may also occur in a tube furnace for about 5–30 minutes at a temperature of about 600°–800° C.

Following the second anneal, a fill material may be formed across the masking structure, the spacers, and the silicide layer. The fill material may be removed (using, e.g., chemical-mechanical polish) to a level commensurate with an upper surface of the masking structure to form fill structures adjacent the spacers. In an embodiment, the fill structures may include a metal such as titanium or aluminum. Titanium is a preferred fill material because it is good conductor and makes good contact with the underlying silicide, especially cobalt silicide. Alternatively, the fill structures may include a dielectric material having etch characteristics differing from the etch characteristics of the masking structure and the spacers. For example, the fill structures may include silicon oxynitride.

Alternatively, the fill structures may include a dielectric material having a dielectric constant greater than about 3.8 (the dielectric constant of silicon dioxide), and preferably greater than about 20. Examples of gate dielectric materials having a high dielectric constant include barium strontium titanate, barium zirconate titanate, lead zirconate titanate, lead lanthanum zirconate titanate, cerium oxide, tin oxide, strontium bismuth tantalate, and tantalum oxide. According to a further alternative, the fill structures may include a material having a dielectric constant less than about 3.8, such as fluorosilicate glass, silicon oxyfluoride, hydrogen silsesquioxane, fluorinated polysilicon, polyphenylquinoxaline, polyqunoline, methysilsesquioxane polymer, and fluoropolymide. Materials having a low dielectric constant are preferred to materials having a high dielectric constant if a dielectric material is used to form the fill structures, such that the fill structures may be retained as interlevel dielectrics with good insulating properties through subsequent processing steps.

The masking structure may be removed from between the spacers using, e.g., a wet etch selective for the masking material, to form an opening between the spacers. Alternatively, the masking structure may be removed using an isotropic plasma etch in which a photoresist may be patterned upon the semiconductor topography using as a mask the reverse of the mask used originally to pattern the masking structure, so that only the masking structure is exposed to the etchant. After the masking structure is removed, a gate dielectric may be formed within the opening. In an embodiment, a conformal dielectric material may be deposited upon the exposed portion of the semiconductor substrate, the exposed inner sidewalls of the spacers, and the upper surface of the fill structures. Preferably, the conformal dielectric includes oxide. Alternatively, a gate dielectric may be grown upon the upper surface of the semiconductor substrate by annealing in an oxygen-containing ambient. Preferably, the thickness of the gate dielectric is between about 14 angstroms and about 25 angstroms.

A conductive gate material may then be deposited within the opening and across the upper surfaces of the fill structures, followed by removal of the conductive gate material to a level commensurate with an upper surface of the fill structures (including any dielectric layer formed upon the fill structures) to form a gate conductor. In an embodiment, the removal may include chemical-mechanical polish of the conductive gate material. In an embodiment, the conductive gate material may include doped polysilicon. Alternatively, the conductive gate material may include a metal, such as tungsten.

In an embodiment, the fill structures may be removed from the semiconductor topography following formation of the gate structure (i.e., the gate dielectric and the gate conductor) using, e.g. a wet etch selective for the fill material. If the fill material includes a metal, an etchant that preferentially removes metal while retaining metal silicide, such as the RCA method, should be used. Alternatively, the fill structures may be retained. If the fill structures include a conductive material such as a metal (e.g., titanium or tungsten), the fill structures may serve as contacts between the source and drain regions and interconnect lines formed upon the fill structures. Titanium is preferred as a metal fill material because the titanium may be used to form salicide to replace or augment salicide damaged during the subsequent dopant implants and anneals. If the fill structures include a dielectric material, the fill structures may serve as interlevel dielectrics. Contact vias may be etched in the fill structures and the vias filled with conductive material such as aluminum or cobalt to form contacts.

In an embodiment in which the fill structures are removed from upon the salicide, a dielectric material may be deposited across the gate structure, the spacers, and the silicide. The dielectric material may be planarized using, e.g., chemical-mechanical polish to form an interlevel dielectric. Following formation of the interlevel dielectric, contact vias may be formed and filled with conductive material in a manner similar to that described previously.

BRIEF DESCRIPTION OF THE DRAWINGS

Other objects and a advantages of the invention will become apparent upon reading the following detailed description and upon reference to the accompanying drawings in which.

Figure 1:
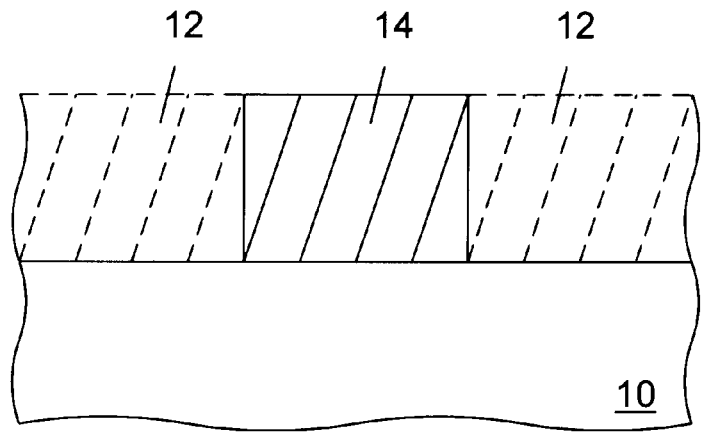
FIG. 1 depicts a partial cross-sectional view of a semiconductor topography according to an embodiment of the present invention, wherein a masking structure is formed upon a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a semiconductor substrate 10 on which a masking layer 12 has been deposited. Preferably, masking layer 12 has a thickness between about 800 angstroms and about 2000 angstroms. Masking layer 12 preferably includes a non-silicon-rich material. Masking layer 12 may include a dielectric such as silicon dioxide, silicon nitride, or silicon oxynitride. The dielectric may be deposited using, e.g., chemical-vapor deposition. As shown in FIG. 1, masking layer 12 has been patterned and etched using, e.g., photolithography techniques that are well known in the art to selectively remove portions of the masking layer (shown in phantom). Portions of masking layer 12 that remain following the etch form masking structure 14 upon semiconductor substrate 10.

Figure 2:
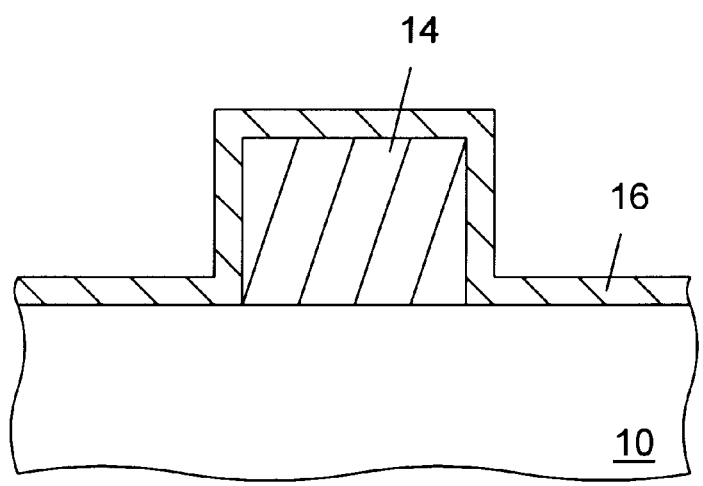
FIG. 2 depicts a partial cross-sectional view of the semiconductor topography, wherein a metal silicide layer is formed self-aligned to the masking structure.

A metal layer may then be deposited across masking structure 14 and semiconductor substrate 10 as shown in FIG. 2. In an embodiment, metal layer 16 may include cobalt deposited by, e.g., sputtering or metal organic chemical-vapor deposition. Alternatively, metal layer 16 may include nickel or a refractory metal, such as titanium. Preferably, metal layer 14 has a thickness between about 100 angstroms and about 300 angstroms. In an embodiment, the upper surface of semiconductor substrate 10 may be cleaned prior to deposition of metal layer 16 using, for example, the well-known RCA method.

Figure 3:
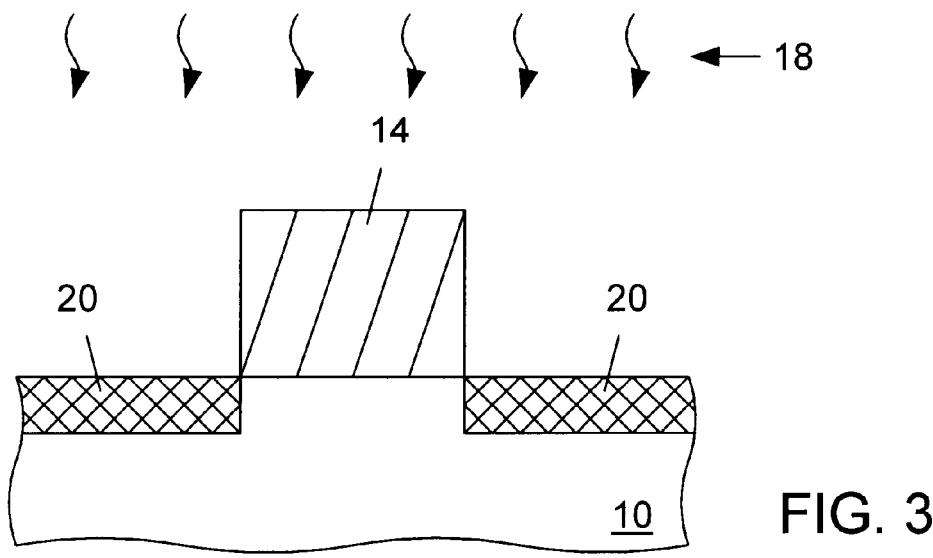
FIG. 3 depicts a partial cross-sectional view of the semiconductor topography, wherein unreacted portions of the metal layer are removed from upon the masking structure.

Following formation of metal layer 16, thermal radiation 18 may be used to anneal semiconductor substrate 10 and the metal layer, as shown in FIG. 3, to form silicide layer 20 upon semiconductor substrate 10 and self-aligned with sidewalls of masking structures 14. Preferably, silicide layer 20 has a thickness between about 200 angstroms and about 600 angstroms. Because masking structures 14 are formed from a non-silicon-rich material, silicon is not available for reaction with the metal layer. As such, silicide is not expected to form upon the masking structure 14. Because titanium, however, is able to form a silicide when it is annealed in the presence of silicon dioxide, metal layer 16 should not include titanium when masking structure 14 includes silicon dioxide. Annealing preferably occurs in a rapid thermal processing chamber at a temperature between about 600° C. and about 700° C. for about 15–60 seconds. Annealing may also occur in a tube furnace for about 5–30 minutes at a temperature of about 650°–850° C. The annealing ambient is preferably an inert ambient, which may contain nitrogen, helium, and/or argon. Following the anneal, unreacted metal may be removed from masking structure 14 using, e.g., a wet etch selective for the unreacted metal.

Figure 4:
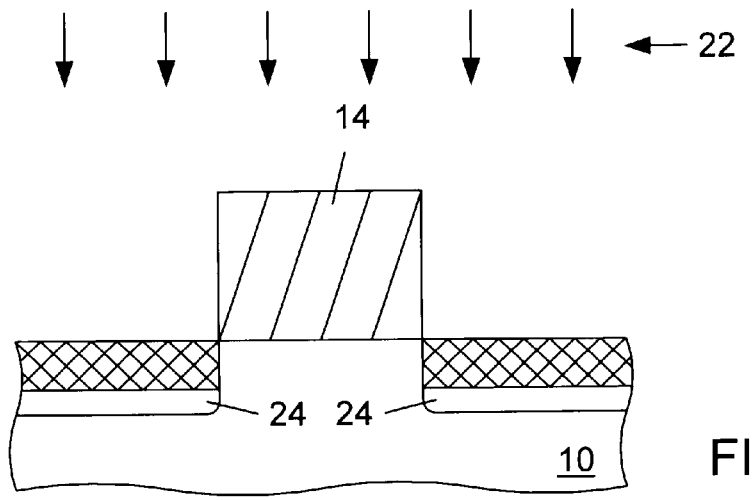
FIG. 4 depicts a partial cross-sectional view of the semiconductor topography, wherein lightly doped drain areas are formed within the semiconductor substrate aligned with sidewalls of the masking structure.

Turning now to FIG. 4, lightly doped drain impurity areas 24 may be formed by, e.g., implanting first impurity ions 22 at a first energy and a first concentration into semiconductor substrate 10 self-aligned with sidewall surfaces of masking structure 14. For example, first impurity ions 22 may be implanted at a concentration of between about $8.0 \times 10^{14}$ $cm^{-2}$ and about $3.0 \times 10^{15}$ $cm^{-2}$ and an energy of between about 0.5 keV and 5.0 keV. Spacers 26 may then be formed adjacent sidewall surfaces of masking structure 14 by, e.g., deposition and selective etching of a conformal dielectric, as is well known in the art. The spacers preferably have a lateral thickness between about 200 angstroms and about 500 angstroms. Spacers 26, depicted in FIG. 5, preferably include a dielectric material having etch characteristics differing from the etch characteristics of masking structure 14 such that the spacers may be retained during subsequent removal of the masking structure. For example, if masking structure 14 includes silicon dioxide, spacers 26 preferably include a material such as silicon nitride. Other LDD processes may also be employed, such as asymmetric processes, multiple LDD processes, etc. Generally, any LDD process may be employed. Also, in some embodiments, an LDD process may not be used at all. Source/drain regions may be formed aligned with the sidewalls of masking structure 14. In such an embodiment, spacers 26 may be omitted.

Figure 5:
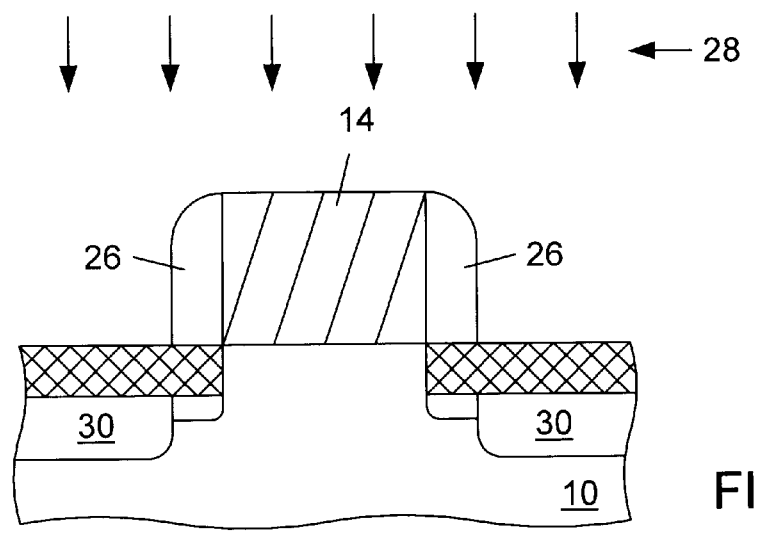
FIG. 5 depicts a partial cross-sectional view of the semiconductor topography, wherein lightly doped drain areas are formed aligned with sidewalls of spacers formed upon the metal silicide and adjacent the sidewalls of the masking structure.
Figure 6:
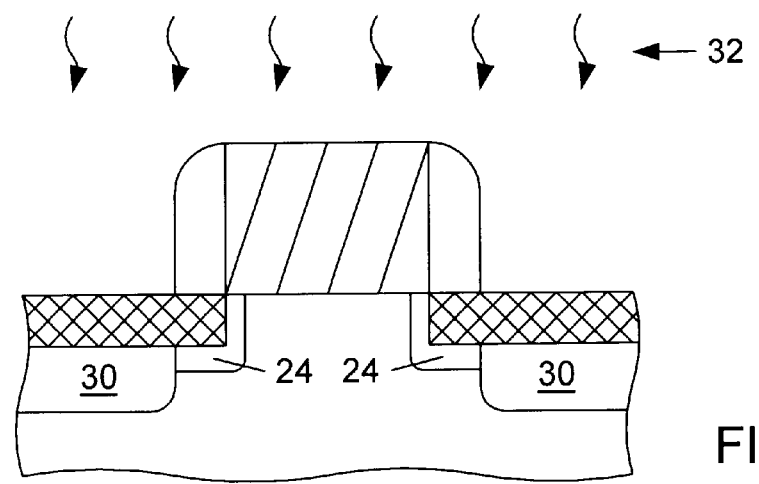
FIG. 6 depicts a partial cross-sectional view of the semiconductor topography, wherein semiconductor substrate is annealed to activate the lightly doped drain areas and the source and drain areas.

Source and drain impurity areas 30 may then be formed in semiconductor substrate 10 self-aligned with sidewalls of spacers 26 by, e.g., implanting second impurity ions 28 at a second energy greater than the first energy and a second concentration greater than the first concentration, as is shown in FIG. 5. For example, second impurity ions may be implanted at a concentration between about $2.0 \times 10^{15}$ cm$^{-2}$ and about $8.0 \times 10^{15}$ cm$^{-2}$ and at an energy between about 1 keV and 10 keV. Lightly doped drain areas 24 and source and drain areas 30 may then be annealed using radiation 32, as shown in FIG. 6. The second anneal may be performed in a rapid thermal processing chamber at temperatures between about 750° C. and about 950° C. for about 10–30 seconds. Annealing may also occur in a tube furnace for about 5–30 minutes at a temperature of about 600°–800° C. The second anneal preferably serves to activate the dopants and to repair damage to the semiconductor substrate caused by ion implantation.

Figure 7:
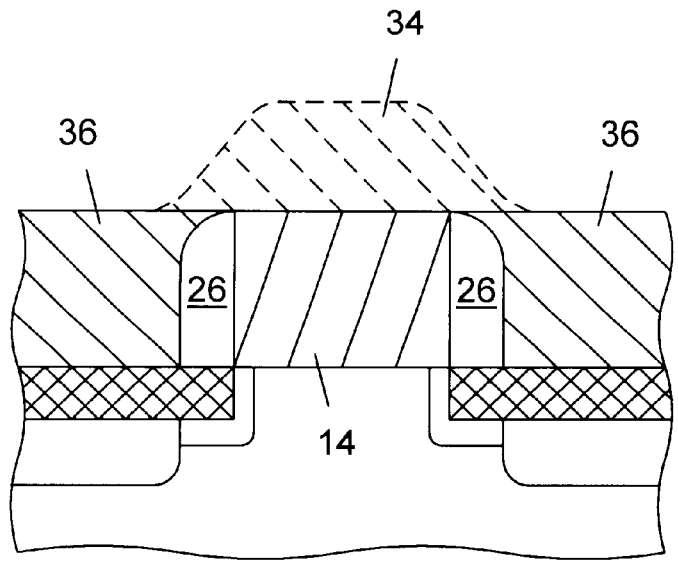
FIG. 7 depicts a partial cross-sectional view of the semiconductor topography, wherein fill structures are formed adjacent the spacers.

Following the anneal, a fill material 34 may be formed across the masking structure 14, the spacers 26, and the silicide layer 20, as depicted in FIG. 7. Fill material 34 may be removed (using, e.g., chemical-mechanical polish) to a level commensurate with an upper surface of masking structure 14 to form fill structures 36 adjacent spacers 26. Removed portions of fill material 34 are shown in phantom in FIG. 7. In an embodiment, fill structures 36 may include a metal such as titanium or aluminum. Titanium is a preferred fill material because it is good conductor and makes good contact with the underlying silicide, especially cobalt silicide. Titanium also advantageously forms a silicide that may be used to replace or augment silicide damaged during the dopant implants and anneals.

Alternatively, fill structures 36 may include a dielectric material having etch characteristics differing from the etch characteristics of masking structure 14 and spacers 26. For example, fill structures 36 may include silicon oxynitride. According to another alternative, fill structures 36 may include a dielectric material having a dielectric constant greater than 3.8 (the dielectric constant of silicon dioxide), and preferably greater than about 20, such as barium strontium titanate, barium zirconate titanate, lead zirconate titanate, lead lanthanum zirconate titanate, cerium oxide, tin oxide, strontium bismuth tantalate, or tantalum oxide. According to a further alternative, fill structures 36 may include a material having a dielectric constant less than about 3.8, such as fluorosilicate glass (FSG), silicon oxyfluoride, hydrogen silsesquioxane, fluorinated polysilicon, poly phenylquinoxaline, polyqunoline, methysilsesquioxane polymer, or fluoro-polymide. A material having a low dielectric constant is preferred to a material having a high dielectric constant if a dielectric material is used to form the fill structures 36, such that the fill structures may be retained as interlevel dielectrics with good insulating properties through subsequent processing steps.

Figure 8:
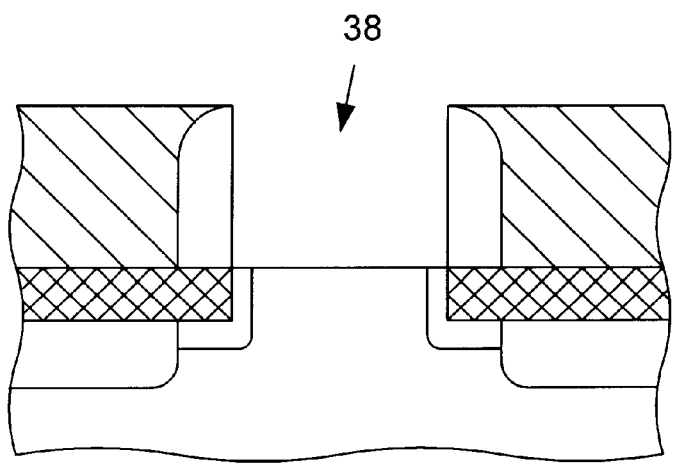
FIG. 8 depicts a partial cross-sectional view of the semiconductor topography, wherein the masking structure is removed.

Turning now to FIG. 8, masking structure 14 may be removed from between spacers 26 using, e.g., a wet etch selective for the masking material, to form an opening 38 between the spacers. Alternatively, the masking structure may be removed using an isotropic plasma etch. A photoresist may be patterned upon the semiconductor topography using as a mask the reverse of the mask used originally to pattern masking structure 14, so that only the masking structure is exposed to the etchant.

Figure 9A:
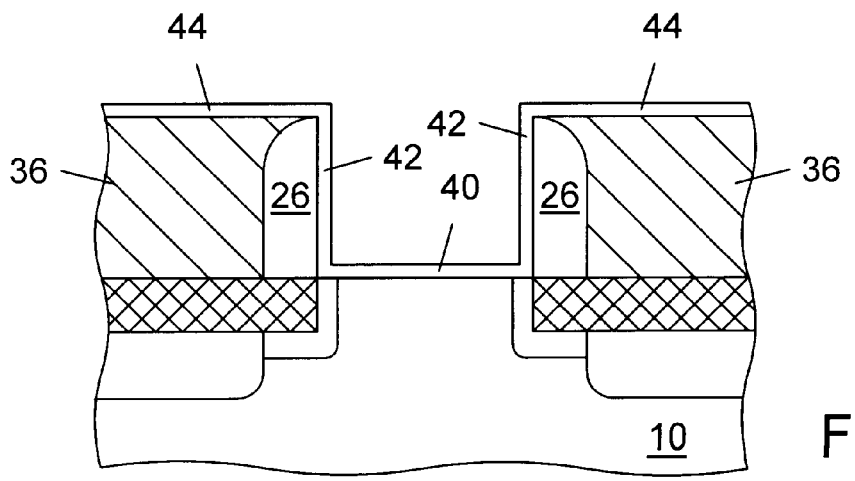
FIG. 9a depicts a partial cross-sectional view of the semiconductor topography, wherein a dielectric is formed upon exposed portions of the semiconductor substrate and upon the fill structures.
Figure 9B:
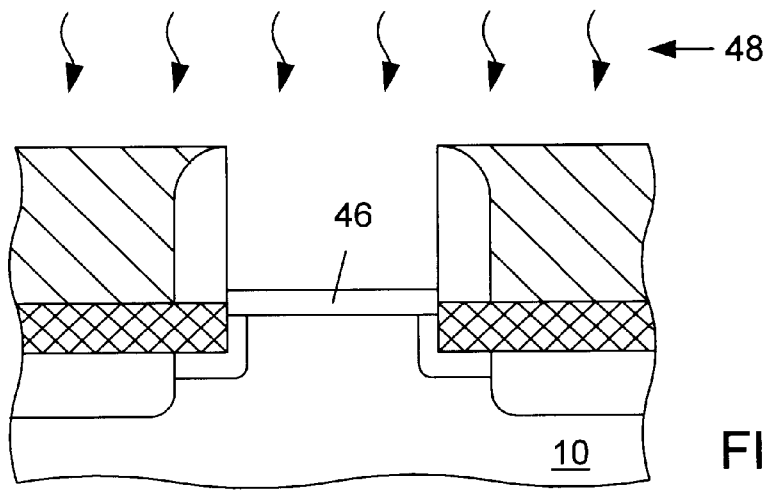
FIG. 9b depicts a partial cross-sectional view of the semiconductor topography according to an alternate embodiment, wherein a dielectric is formed upon exposed portions of the semiconductor substrate.

In an embodiment, a conformal dielectric may be deposited upon the exposed portions of the semiconductor substrate 10 and the spacers 26 and across the fill structures 36, as shown in FIG. 9a. The conformal dielectric preferably includes gate dielectric 40 upon the upper surface of semiconductor 10; spacer dielectrics 42 adjacent sidewall surfaces of spacers 26; and capping dielectrics 44 upon upper surfaces of the fill structures 36. Preferably, the dielectrics 40, 42, and 44 include silicon dioxide. Alternatively, a gate dielectric 46 may be grown upon the exposed upper surface of semiconductor substrate 10, as shown in FIG. 9b, by, e.g., annealing in the presence of thermal radiation 48. The anneal may be performed in an oxidizing ambient such that gate dielectric 46 includes silicon dioxide. Preferably, the gate dielectric is formed to a thickness of between about 14 angstroms and about 25 angstroms.

Figure 10:
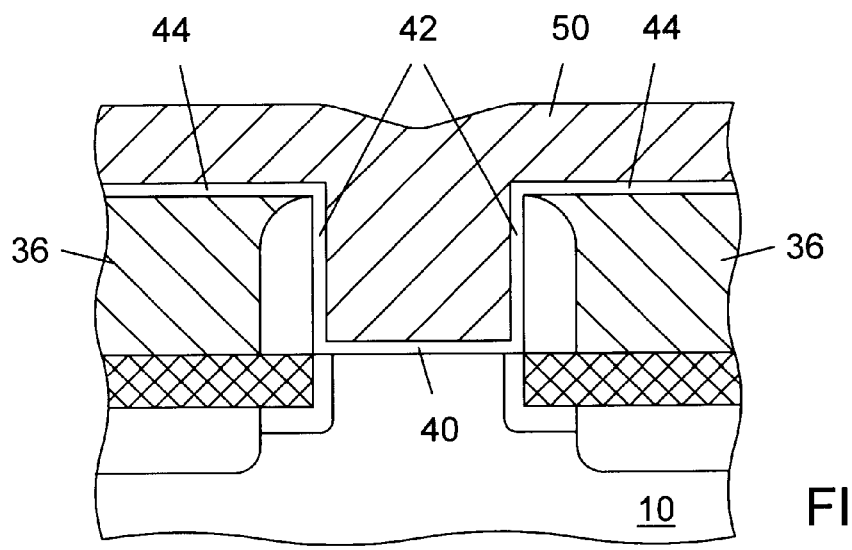
FIG. 10 depicts a partial cross-sectional view of the semiconductor topography, wherein a conductive gate material is deposited upon the dielectric.

Following formation of the dielectrics as shown in FIG. 9a or 9b, a conductive gate material may be formed within opening 38 and above fill structures 36, as depicted in FIG. 10. In an embodiment, conductive gate material 50 may include polysilicon. Alternatively, conductive gate material 50 may include a metal such as tungsten. It should be noted that although FIG. 10 and subsequent figures depict dielectrics 40, 42, and 44 as described with respect to FIG. 9a, the process flow described herein could apply equally to a structure having only the dielectric 46, as shown in FIG. 9b.

Figure 11:
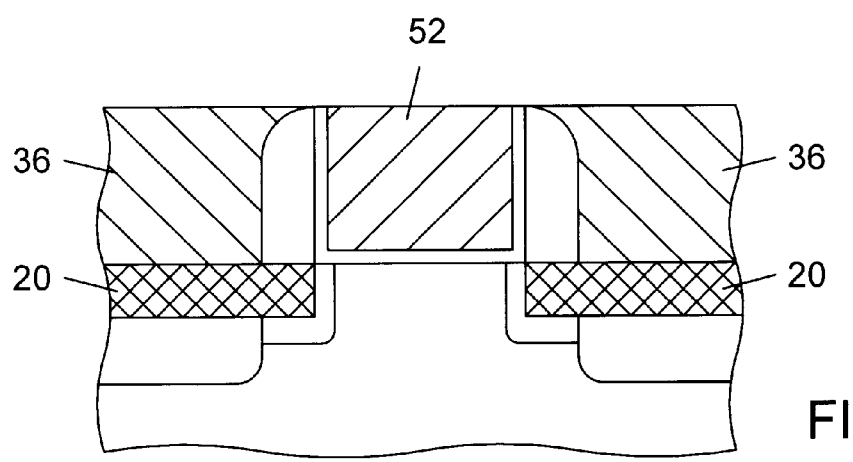
FIG. 11 depicts a partial cross-sectional view of the semiconductor topography, wherein the conductive gate material is planarized to form a gate conductor.

Conductive gate material 50 may then be planarized as shown in FIG. 11 using, e.g., chemical-mechanical polish, to form gate conductor 52. In an embodiment in which capping dielectric 44 is present, the capping dielectric preferably serves as an etch stop during the polishing. The capping dielectric may be removed during a subsequent etch step. Alternatively, the capping dielectric may be removed during the chemicalmechanical polish.

Figure 12:
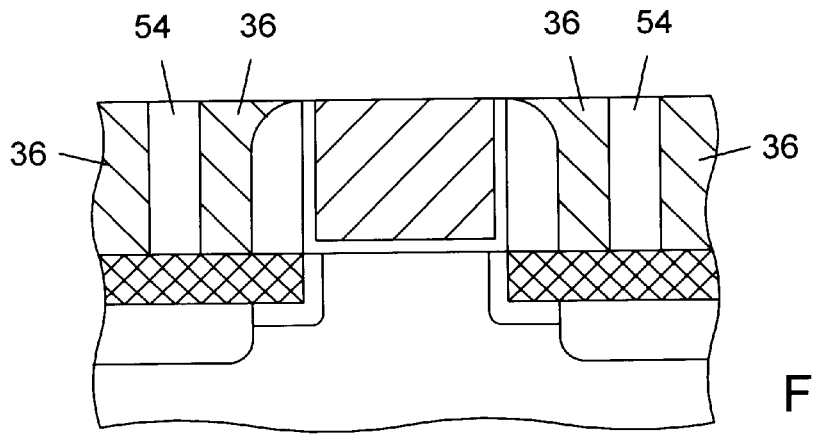
FIG. 12 depicts a partial cross-sectional view of the semiconductor topography, wherein contacts are formed within the fill structures.

In an embodiment, fill structures 36 may be retained upon the silicide 20. If fill structures 36 include a conductive material such as a metal, the fill structures may serve as contacts between the source and drain regions and interconnect lines formed upon the fill structures (not shown). An additional anneal may be performed under conditions similar to the anneal described with respect to FIG. 3 at this point to replace or augment the silicide if damage has occurred as the result of the LDD and source-drain formation. If fill structures 36 include a dielectric material, the fill structures may serve as interlevel dielectrics. Contact vias may be etched in the fill structures and the vias filled with conductive material such as aluminum or cobalt to form contacts 54, as shown in FIG. 12.

Figure 13:
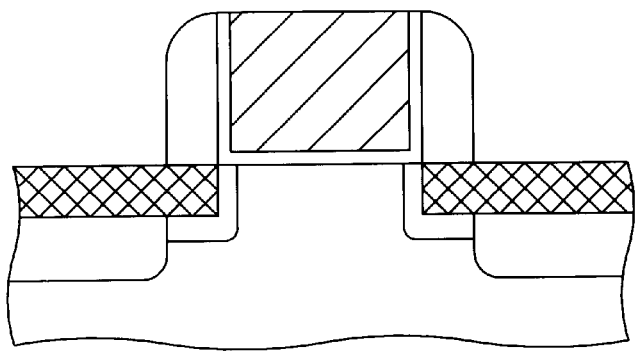
FIG. 13 depicts a partial cross-sectional view of the semiconductor topography according to an alternative embodiment, wherein the fill structures are removed.
Figure 14:
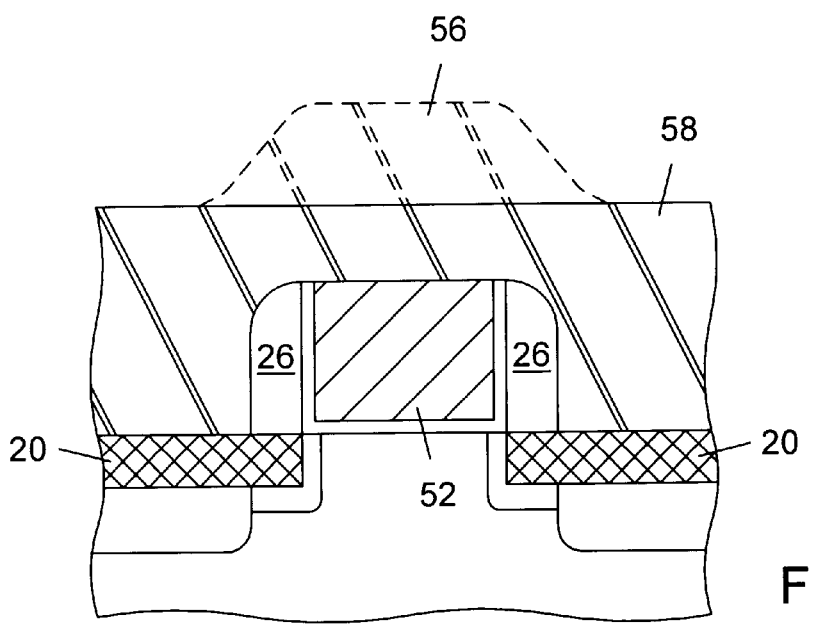
FIG. 14 depicts a partial cross-sectional view of the semiconductor topography, wherein an interlevel dielectric is formed upon the gate conductor, the spacers, and exposed portions of the silicide.

Alternatively, fill structures 36 may be removed from upon silicide 20 and spacers 26, as shown in FIG. 13, using, e.g., a wet etch selective for the fill structure material. If the fill structures and the spacers have similar etch characteristics, spacers 26 may be removed concurrently with fill structures 36. A dielectric material 56 may then be deposited across gate conductor 52, spacers 26, and silicide 20, as depicted in FIG. 14. Dielectric material 56 may be planarized using, e.g., chemical-mechanical polish to form interlevel dielectric 58. Removed portions of dielectric material 56 are shown in phantom in FIG. 14. Following formation of interlevel dielectric 58, contact vias may be formed and filled with conductive material in a manner similar to that previously described to give a structure similar to the structure depicted in FIG. 12.

It will be appreciated to those skilled in the art having the benefit of this disclosure that this invention is believed to provide a method for forming a transistor having metal silicide areas in close proximity to the channel region. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor comprising:

a gate structure comprising a gate conductor spaced above a semiconductor substrate by a gate dielectric;

metal silicide formed upon said semiconductor substrate, wherein an edge of said metal silicide on either side of said gate conductor is elevationally lower than said gate conductor and approximately vertically aligned to sidewalls of said gate conductor; and spacers adjacent sidewalls of said gate structure and upon said metal silicide.

2. The transistor as recited in claim 1 wherein said gate conductor comprises a metal.

3. The transistor as recited in claim 2 wherein said metal comprises tungsten.

4. The transistor as recited in claim 1 wherein said gate conductor comprises polysilicon.

5. The transistor as recited in claim 1 wherein said gate dielectric comprises silicon dioxide.

6. The transistor as recited in claim 1 wherein said gate structure further comprises spacer dielectrics adjacent sidewall surfaces of said gate conductor.

7. The transistor as recited in claim 1 wherein said metal silicide comprises cobalt silicide.

8. The transistor as recited in claim 1 wherein said spacers comprise silicon nitride.

9. The transistor as recited in claim 1, further comprising lightly doped drain areas in said semiconductor substrate beneath said spacers.

10. The transistor as recited in claim 8, further comprising source and drain areas in said semiconductor substrate laterally spaced from a channel region of said semiconductor substrate.

11. The transistor as recited in claim 1, further comprising source and drain areas in said semiconductor substrate aligned with sidewall surfaces of said gate structure.

12. The transistor as recited in claim 1, further comprising a fill material upon said silicide and said spacers.

13. The transistor as recited in claim 12 wherein said fill material comprises a metal.

14. The transistor as recited in claim 13 wherein said metal comprises titanium.

15. The transistor as recited in claim 12 wherein said fill material comprises a dielectric.

16. The transistor as recited in claim 15 wherein said fill material comprises silicon oxynitride.

17. The transistor as recited in claim 15 wherein said fill material has a dielectric constant greater than about 3.8.

18. The transistor as recited in claim 15 wherein said fill material has a dielectric constant less than about 3.8.

19. The transistor as recited in claim 12, further comprising contacts formed within said fill material and extending from an upper surface of said fill material to said silicide.

20. A transistor comprising:

a gate structure comprising a gate conductor spaced above a semiconductor substrate by a gate dielectric;

spacers formed adjacent opposing sidewalls of said gate structure; and metal silicide formed upon said semiconductor substrate and extending laterally underneath said spacers.

21. The transistor as recited in claim 20, wherein said metal silicide extends proximate to a channel region beneath said gate structure.

22. The transistor as recited in claim 20, wherein said metal silicide is vertically aligned with said gate structure.

23. The transistor as recited in claim 20, wherein said metal silicide is vertically aligned with said gate conductor.

24. The transistor as recited in claim 20 wherein said gate conductor comprises a metal.

25. The transistor as recited in claim 24 wherein said metal comprises tungsten.

26. The transistor as recited in claim 20 wherein said gate conductor comprises polysilicon.

27. The transistor as recited in claim 20 wherein said gate dielectric comprises silicon dioxide.

28. The transistor as recited in claim 20 wherein said gate structure further comprises spacer dielectrics adjacent sidewall surfaces of said gate conductor.

29. The transistor as recited in claim 20 wherein said metal silicide comprises cobalt silicide.

30. The transistor as recited in claim 20 wherein said spacers comprise silicon nitride.

31. The transistor as recited in claim 20, further comprising lightly doped drain areas in said semiconductor substrate beneath said spacers.

32. The transistor as recited in claim 20, further comprising, source and drain areas in said semiconductor substrate laterally spaced from a channel region of said semiconductor substrate.

33. The transistor as recited in claim 20, further comprising source and drain areas in said semiconductor substrate self-aligned with sidewall surfaces of said gate structure.

34. The transistor as recited in claim 20, further comprising a fill material upon said metal silicide and said spacers.

35. The transistor as recited in claim 34 wherein said fill material comprises a metal.

36. The transistor as recited in claim 35 wherein said metal comprises titanium.

37. The transistor as recited in claim 34 wherein said fill material comprises a dielectric.

38. The transistor as recited in claim 37 wherein said fill material comprises silicon oxynitride.

39. The transistor as recited in claim 37 wherein said fill material has a dielectric constant greater than about 3.8.

40. The transistor as recited in claim 37 wherein said fill material has a dielectric constant less than about 3.8.

41. The transistor as recited in claim 34, further comprising contacts formed within said fill material and extending from an upper surface of said fill material to said silicide.

* * * * *